US012456607B2

(12) United States Patent
Ramaswamy et al.

(10) Patent No.: US 12,456,607 B2
(45) Date of Patent: Oct. 28, 2025

(54) AUXILIARY PLASMA SOURCE FOR ROBUST IGNITION AND RESTRIKES IN A PLASMA CHAMBER

(71) Applicant: Applied Materials, Inc., Santa Clara, CA (US)

(72) Inventors: Kartik Ramaswamy, San Jose, CA (US); Kostiantyn Achkasov, Lyons (FR); Nicolas J. Bright, Mountain Lakes, NJ (US); Fernando M. Silveira, Livermore, CA (US); Yang Yang, Cupertino, CA (US); Yue Guo, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 709 days.

(21) Appl. No.: 17/551,698

(22) Filed: Dec. 15, 2021

(65) Prior Publication Data

US 2023/0187176 A1 Jun. 15, 2023

(51) Int. Cl.
*H01J 37/32* (2006.01)

(52) U.S. Cl.
CPC .. *H01J 37/32247* (2013.01); *H01J 37/32091* (2013.01); *H01J 37/321* (2013.01)

(58) Field of Classification Search
CPC ........... H01J 37/43347; H01J 37/32357; H01J 37/32192; H01J 37/321; H01J 37/32091
See application file for complete search history.

(56) References Cited

U.S. PATENT DOCUMENTS 9,466,466 B1 10/2016 Zhong et al.
2002/0115301 A1 8/2002 Savas
2005/0260837 A1* 11/2005 Walther .............. H01L 21/2236 438/513
2010/0048003 A1* 2/2010 Sung ................. H01J 37/32091 156/345.43
2013/0214679 A1* 8/2013 Preston ................. H01J 65/044 315/34
2014/0239813 A1 8/2014 Van Zyl et al.
2014/0370715 A1* 12/2014 Chung .............. H01J 37/32174 156/345.48
2019/0066979 A1 2/2019 Shoeb et al.

FOREIGN PATENT DOCUMENTS

TW 202120733 A 6/2021
TW 202127502 A 7/2021
WO WO2020/163115 * 8/2020
WO 2021118862 A2 6/2021

OTHER PUBLICATIONS

Application No. PCT/US2022/051622, International Search Report and Written Opinion, Mailed on Apr. 17, 2023, 8 pages.

* cited by examiner

*Primary Examiner* — Joseph A Miller, Jr.
(74) *Attorney, Agent, or Firm* — Kilpatrick Townsend & Stockton LLP

(57) ABSTRACT

A semiconductor processing system may include a semiconductor processing chamber configured to execute a recipe on a semiconductor wafer. The system may include a first plasma source to provide plasma to the semiconductor processing chamber and to be duty cycled during an execution of the recipe. The system may also include a second plasma source configured to maintain the plasma in the semiconductor processing chamber while the first plasma source is duty cycled.

18 Claims, 7 Drawing Sheets

AUXILIARY PLASMA SOURCE FOR ROBUST IGNITION AND RESTRIKES IN A PLASMA CHAMBER

TECHNICAL FIELD

This disclosure generally relates to an auxiliary plasma source for use in semiconductor manufacturing. More specifically, this disclosure describes techniques for ensuring more uniform ignition and re-ignition of plasma within a main plasma chamber during complex duty cycles using multiple plasma sources.

BACKGROUND OF THE INVENTION

In order to generate plasma used for processes in semiconductor manufacturing, energy is typically added to a neutral gas at levels that ionize the atoms within a semiconductor processing chamber. Argon (Ar), for example, may have an ignite or "strike" requirement of 500 W to reach a plasma state and require an energy of 15 W at 40 MHz to maintain the plasma state. Current semiconductor manufacturing techniques may use duty cycles, where there are periods with a plasma source in an ON state that may include a plurality of power levels, each characterized by an energy provided to the plasma, and periods where the plasma source is in an OFF state, where the plasma may be allowed to be quenched within the chamber. During duty cycling, power ranging from approximately 30 W to 8000 W may be applied at the beginning of each ON cycle. As manufacturing techniques require more complicated duty cycles, and/or duty cycles with longer OFF periods between ON periods, the plasma in the chamber has longer to cool down during the OFF periods, quenching the plasma. Variation in plasma generation therefore increases, leading to a higher incidence of manufacturing defects.

BRIEF SUMMARY OF THE INVENTION

In some embodiments, a method for providing plasma to a semiconductor processing chamber may include processing a semiconductor wafer in the semiconductor processing chamber according to a recipe. Processing the semiconductor wafer may include holding the semiconductor processing chamber at a constant pressure. The method may also include operating a first plasma source according to a recipe. The first plasma source may be coupled to the semiconductor processing chamber and configured to be duty cycled during an execution of the recipe. The first plasma source may provide plasma to the semiconductor processing chamber. The first plasma source may be duty cycled between a plurality of power levels. The plurality of power levels may include a first power level that results in the first plasma source striking a plasma within the semiconductor processing chamber. The plurality of power levels may also include a second power level that results in the plasma in the semiconductor processing chamber being quenched and transitioning from a plasma state to a gaseous state. A third power level may restrike the plasma in the semiconductor processing chamber, resulting in the plasma transitioning from a gaseous state to a plasma state. The third power level may use less energy than the first power level. The plasma may include Argon. The method may include operating a second plasma source, configured to maintain the plasma during the execution of the recipe while the first plasma source is duty cycled. The second plasma source may provide a supply of electrons to the first plasma source. The second plasma source may also or alternatively provide a supply of high-energy electrons to the semiconductor processing chamber.

In some embodiments, a semiconductor processing system may include a semiconductor processing chamber configured to execute a recipe to process a semiconductor wafer. The system may include a first plasma source, configured to provide plasma to the semiconductor processing chamber. The first plasma source may also be configured to be duty cycled during an execution of the recipe. The recipe being executed on the semiconductor wafer may be characterized by a duty cycle, requiring the first plasma source to be cycled between a plurality of power levels. The duty cycle may operate from approximately 5% to 95%. The system may also include a second plasma source configured to maintain the plasma in the semiconductor processing chamber while the first plasma source is duty cycled. The second plasma source may be a microwave coaxial resonator. The microwave coaxial resonator may be configured as an electron floodgun. The second plasma source may be toroidal plasma source. The toroidal plasma source may be configured as an electron floodgun. The second plasma source may be a surface wave plasma source. The surface wave plasma source may use capacitive coupling, or may use inductive coupling to generate the plasma.

In some embodiments, a semiconductor processing system may include a semiconductor processing chamber configured to execute a recipe to process a semiconductor wafer. The system may include a plasma source configured to provide a plasma to the semiconductor processing chamber. The plasma source may also be configured to be duty cycled during an execution of the recipe. The plasma source may include a toroidal plasma source or a coaxial resonator. The system may include a surface wave plasma source, configured to maintain the plasma in the semiconductor processing chamber during the execution of a recipe on the semiconductor wafer.

DETAILED DESCRIPTION

Figure 1:
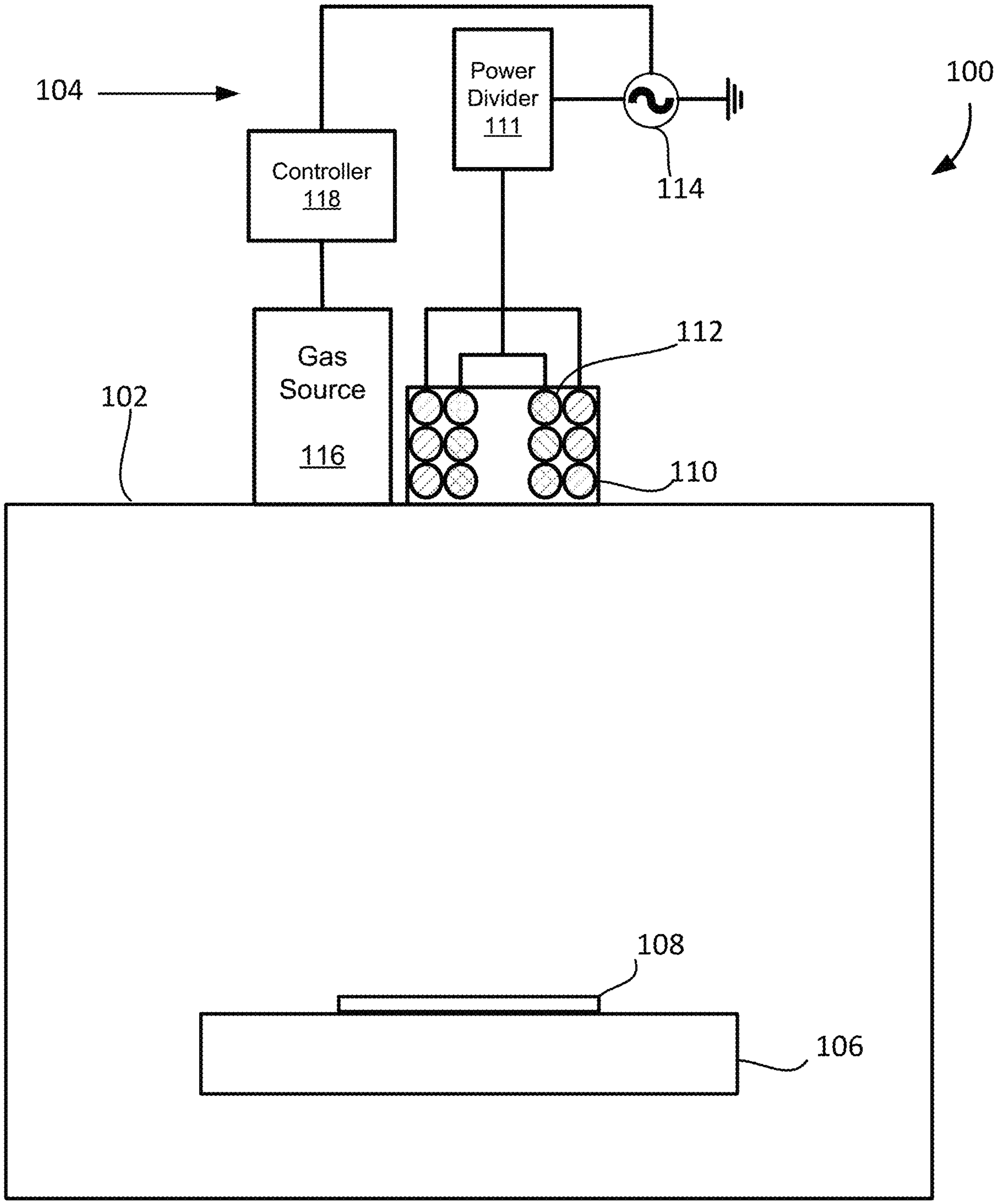
FIG. 1 illustrates an example of a semiconductor manufacturing system, according to some embodiments.

As discussed above, the current techniques used in semiconductor manufacturing may require more complex duty cycles, sometimes with a frequency in a range between approximately 5 Hz to 5000 Hz. In other embodiments, the frequency may be in a range of 0.01 Hz to 200 Hz. The duty cycle may vary an energy level of the plasma according to a recipe being executed on a semiconductor wafer. The recipe may cause the energy level to be varied at multiple levels, for example, between 300 W to 600 W, depending on the pressure in the chamber.

Generally speaking, the pressures needed to strike a plasma are higher than those needed to sustain the plasma within the chamber at a given energy level. For example, striking an argon plasma at 25 mTorr may require an inductive coupling power (ICP) of 500 W, while a desired operating pressure within the semiconductor processing chamber may be within a range of 1 mTorr to 400 mTorr. Therefore, pressures inside the semiconductor processing chamber are raised and lowered multiple times, according to a recipe.

However, raising the pressure in the semiconductor processing chamber to enable consistent strikes and restrikes of plasma may cause manufacturing issues. For example, unwanted polymer deposition may occur when the pressure inside the semiconductor processing chamber is raised for a restrike. When a recipe calls for multiple strikes and restrikes, there are additional periods of high pressure, and thus more opportunity for unwanted polymer deposition and other process variations.

Embodiments described in this disclosure solve these and other technical problems by adding an additional auxiliary plasma source to the chamber. The two plasma sources (sometimes referred to as "main" and "auxiliary" plasma sources, or alternatively as a "first" plasma source and a "second" plasma source) work together to strike and maintain a constant plasma in the chamber. The main plasma source may be configured to provide and maintain the plasma and operate during the execution of a recipe on a semiconductor wafer. The main plasma source may be cycled between different power levels, including levels where the plasma is quenched and the main plasma source is in an "OFF" state. For example, maintaining the plasma may only require energy 15 W at 40 MHz compared to the 500 W and GHz-range frequencies used to strike or re-strike the plasma, dependent on the recipe and a design of the main plasma source.

The auxiliary, or second plasma source may be configured to maintain the plasma provided by the main plasma source in the semiconductor processing chamber. The second plasma source may operate throughout the execution of the wafer recipe. In some configurations, the auxiliary plasma source may reduce a sustaining power required by the main plasma source. The auxiliary plasma source may be configured to generate a "leaky" plasma that is diffused into the chamber, or to drive the plasma into the semiconductor processing chamber by creating an electric potential difference relative to the chamber body to provide a supply of electrons to the chamber.

The second plasma source may be implemented using a number of different technical solutions, including a surface wave plasma source, such as a surfatron apparatus, that generates the plasma using surface waves. A microwave coaxial resonator plasma source may be used, and may be configured as an electron floodgun. A toroidal plasma source may also be used, and may also be configured as an electron flood gun. In some embodiments, two or more auxiliary plasma sources may be utilized, providing a more consistent plasma density within the semiconductor processing chamber.

By providing a source of electrons to the semiconductor chamber using the auxiliary plasma source, the main plasma source may be cycled between power levels and/or turned off during the execution of a recipe. Because the auxiliary plasma source maintains the plasma in the chamber during the duty cycles of the main plasma source, a restrike of the plasma is not required each time the duty cycle of the main plasma source enters the ON state. Even in cases where a restrike may be needed, the power from the main plasma source may be reduced when operating in conjunction with the auxiliary plasma source. Additionally, the pressure and other environmental characteristics in the chamber need not be changed when performing a restrike with the auxiliary plasma source. Instead, the environmental characteristics of the chamber can be maintained during a restrike, thereby reducing process variations during duty cycling of the main plasma source. Embodiments of this disclosure thereby reduce the power needed to maintain a plasma within the semiconductor processing chamber, and may eliminate the need to adjust pressure, power, and capacitive matching network for the re-strikes required during duty cycling.

FIG. 1 illustrates an example of a semiconductor manufacturing system, according to some embodiments. The system 100 may include a semiconductor processing chamber 102 and an main plasma source 104. The main plasma source 104 may include, for example, an inductively coupled plasma source with a first coil 110, a second coil 112, an alternating current (AC) power source 114, a power divider 111, a controller 118 and a gas source 116. The main plasma source 104 may also include a capacitively coupled plasma source.

The semiconductor processing chamber 102 may include a wafer platform 106 supporting a semiconductor wafer 108. A recipe may be executed on semiconductor wafer 108 during a semiconductor manufacturing process. As used herein, a "recipe" may refer to a set of instructions that control the operation of the semiconductor processing chamber 102. For example, the recipe may include time-series setpoints for environmental conditions, such as pressure, temperature, gas concentrations, gas flow rates, and/or other conditions. The recipe may also include voltages, currents, power settings, duty cycles, and other electronic stimuli that may be applied to various components of the semiconductor processing chamber 102 in order to generate a plasma, deposit films or layers on the semiconductor wafer 108, polish or etch layers on the semiconductor wafer 108, and/or perform other processes on the semiconductor wafer 108.

The controller 118 may cause a gas may be fed into the semiconductor processing chamber 102 from the gas source 116, according to a recipe. The controller 118 may also cause a current to be output by AC power source 114 according to a recipe. The power divider 111 may split the current between the coils 110 and 112. The current may be supplied at a sufficient power level and frequency such that the gas is ionized by the resulting electromagnetic field, striking a plasma within the semiconductor processing chamber 102. The plasma may fill the semiconductor processing chamber 102 through diffusive effects, or may be driven by an electrical potential difference between the plasma source 104 and the semiconductor processing chamber 102.

The recipe may include a duty cycle where the controller 118 causes the AC power source 114 to be turned on and off and/or to vary a power level output by the AC power source 114. Accordingly, the main plasma source 104 may be in an ON state characterized by one or more power levels, or the main plasma source may be in an OFF state. In some embodiments, the ON state may include a plurality of power levels. A first power level may result in the first plasma source striking a plasma in the semiconductor processing chamber 102. A second power level may allow the plasma in the semiconductor processing chamber 102 to be quenched or transition back to a gaseous state. A third power level may restrike the plasma in the semiconductor processing chamber 102, causing the plasma to transition from a gaseous state to a plasma state. The third power level may use less energy than the first power level.

In situations where the recipe causes the main plasma state be in an OFF state for a portion of the recipe, the plasma may need to be reignited or "restruck" when the duty cycle calls for it. Then, the main plasma source 104 may use more power to restrike the plasma than it would take to sustain the plasma. An increase of an operating pressure within the semiconductor processing chamber 102 may also be required to restrike the plasma. The increase in pressure required to restrike the plasma may lead to manufacturing defects, such as the unwanted deposition or creation of a polymer on the semiconductor wafer 108.

Additionally, as plasma is only being provided to the semiconductor processing chamber 102 by main plasma source 104, the plasma may not fill the semiconductor processing chamber 102 uniformly. Thus, the semiconductor wafer 108 may be exposed to varying amounts of plasma. This may lead to further manufacturing defects.

Although FIG. 1 shows the main plasma source 104 as an inductively coupled plasma source, many well-known types of main plasma sources may be used, including capacitively coupled plasma sources, and other source types. This list is not exhaustive, and any plasma source may be used as the main plasma source 104. Additionally, although the main plasma source 104 is shown external to semiconductor processing chamber 102, other configurations are possible, including where the main plasma source 104 is internal to the semiconductor processing chamber 102, and the plasma forms inside the semiconductor processing chamber 102 instead of filling the chamber.

Figure 2:
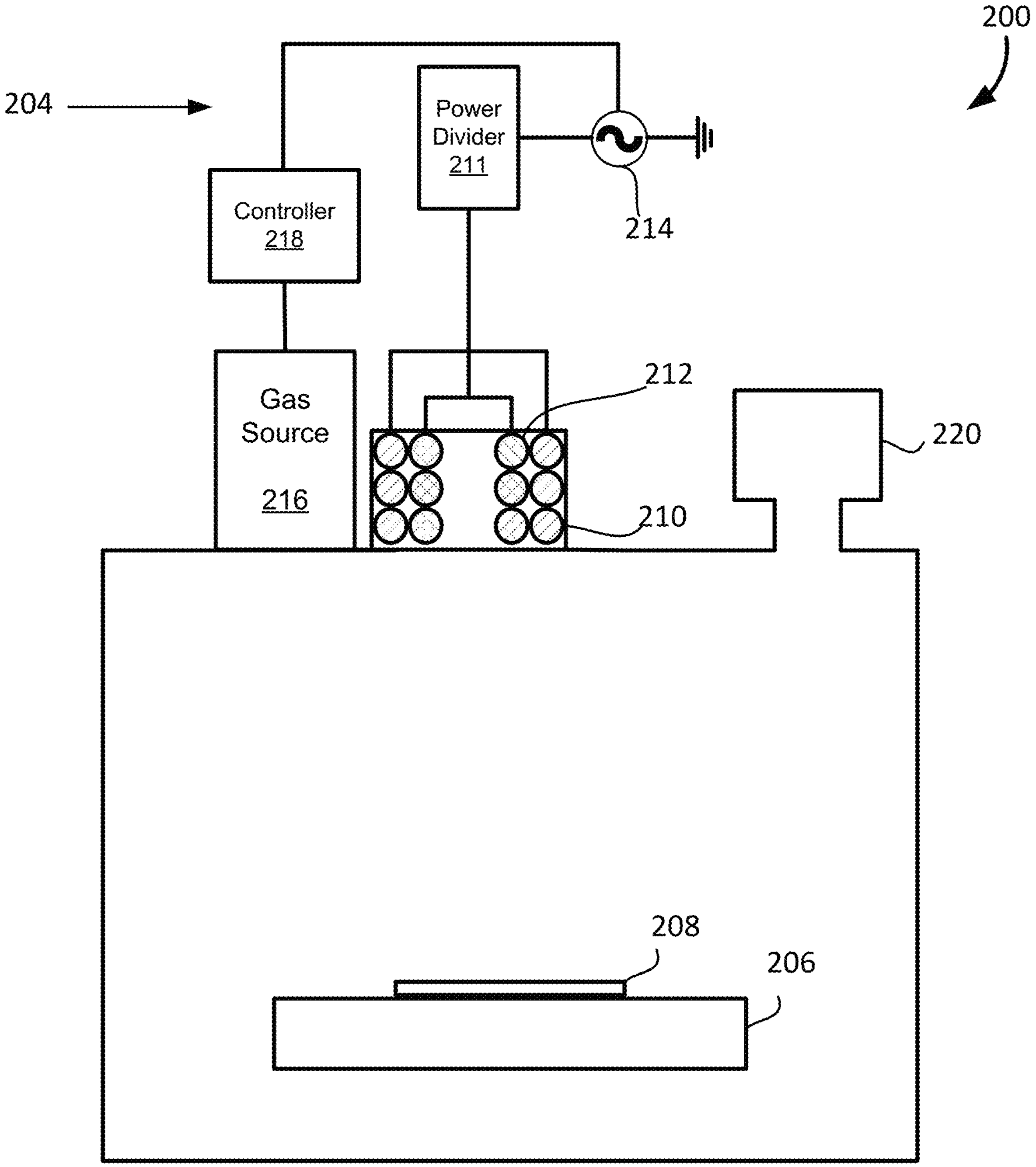
FIG. 2 illustrates an example of a semiconductor processing system with an auxiliary plasma source, according to some embodiments.

FIG. 2 shows an example of a semiconductor processing system with an auxiliary plasma source, according to some embodiments. The system 200 may include a semiconductor processing chamber 202, a main plasma source 204, and an auxiliary plasma source 220. In some embodiments, the semiconductor processing chamber 202 and the main plasma source 204 may be similar to the main plasma source 104 pictured in FIG. 1. The labelled components 202-218 may therefore function similarly to the corresponding components 102-118 in FIG. 1. As in FIG. 1, although the main plasma source 204 is shown as an inductively coupled power source, a capacitively coupled power source, or any other type of plasma source may be used instead of or in addition to an inductively coupled power source.

The auxiliary plasma source 220 may be configured to maintain a plasma in the semiconductor processing chamber 202 during the execution of the recipe while the main plasma source is duty cycled. The auxiliary plasma source 220 may be in an ON state throughout a duration of a recipe being executed on a semiconductor wafer 208. In some embodiments, the auxiliary plasma source may be held at a single power level for the duration of a recipe being executed on semiconductor wafer 208. The auxiliary plasma source 220 may include any type of plasma source, including a surface wave generating plasma source such as a surfatron, a microwave coaxial resonator in various configurations, a toroidal plasma generator, and so forth. The auxiliary plasma source may also include a coaxial resonator with a quartz reactor. Furthermore, although only one auxiliary plasma source is shown, there may be any number of auxiliary plasma sources, placed in any configuration. For example, a plurality of auxiliary plasma sources may be distributed around the semiconductor processing chamber 202 to more uniformly maintain the density of the plasma. Additionally, the auxiliary plasma source 220 may be added to a semiconductor manufacturing system such as the system 100 in FIG. 1 after the semiconductor manufacturing system has been fabricated where the main plasma source 204 is an integral part of the semiconductor processing system.

The auxiliary plasma source 220 may maintain the plasma in the semiconductor processing chamber 202 by providing a supply of electrons to the semiconductor processing chamber 202. In some embodiments, the electrons may be provided by the auxiliary plasma source 220 as a "leaky" plasma, entering the semiconductor processing chamber 202 through diffusive effects. In other embodiments, the auxiliary plasma source may be configured as an electron floodgun, and the electrons may enter the semiconductor processing chamber 202 as an electron beam. Any type of plasma source, some of which described in detail below, may be configured to provide a leaky plasma or be configured as an electron floodgun.

In some embodiments, the auxiliary plasma source 220 may operate at microwave frequencies ($3\times10^8$–$3\times10^{11}$ Hz). By operating at microwave frequencies, the auxiliary plasma source 220 may be physically smaller than the main plasma source 204. Additionally, the power used by the auxiliary plasma source 220 may be less than that used by the main plasma source 204. In other embodiments, the auxiliary plasma source may be configured to operate in a radio frequency (RF) range, such as $3\times10^5$ to $3\times10^8$ Hz.

The system 200 may be used to execute a recipe on the semiconductor wafer 208. The main plasma source may be configured to provide a plasma to the semiconductor processing chamber 202, and configured to be duty cycled during an execution of the recipe. The recipe may include a duty cycle that requires the main plasma source 204 to be alternated between a plurality of power levels. In some embodiments, a first power level may result in the first plasma source striking a plasma in the semiconductor processing chamber 202. A second power level may result in the plasma in the semiconductor processing chamber 202 being quenched and transitioning to a gaseous state. A third power level may restrike the plasma in the semiconductor processing chamber 202, resulting in the plasma transitioning from a gaseous state to a plasma state. The third power level may use less energy than the first power level.

In some embodiments, a first power level may result in a plasma being struck in the semiconductor processing chamber 202. Ae second power level may be characterized by a reduction in an energy of the plasma. In that case, the auxiliary plasma source 220 may sustain the plasma in the semiconductor processing chamber 202. The third power level may cause the main plasma source 204 to raise the energy of the plasma. Because the plasma may be sustained by the auxiliary plasma source 220, the plasma may not need to be restruck.

The supply of electrons provided by auxiliary plasma source 220 may allow the main plasma source 204 to transition from one power level directly to another. The supply of electrons may act as seed electrons, allowing the plasma to transition to the energy indicated by the recipe, instead of at a higher power level that may be required to restrike the plasma. In other words, the auxiliary plasma source 220 may act as an ignition source for the main plasma source 204, while also maintaining the plasma in the semiconductor processing chamber 202, allowing the main plasma source to change power levels without restriking.

Additionally, the semiconductor processing chamber 202 may be held at a constant pressure. Because the plasma in the semiconductor processing chamber 202 may be maintained by the auxiliary plasma source 220, the pressure inside the semiconductor processing chamber 202 may be held at a desired operating pressure instead of being raised during the execution of the recipe in order to restrike the plasma. Without the need to raise the pressure within the semiconductor processing chamber 202 to the higher restriking pressures, manufacturing defects such as unwanted polymer deposition may be mitigated.

Figure 3:
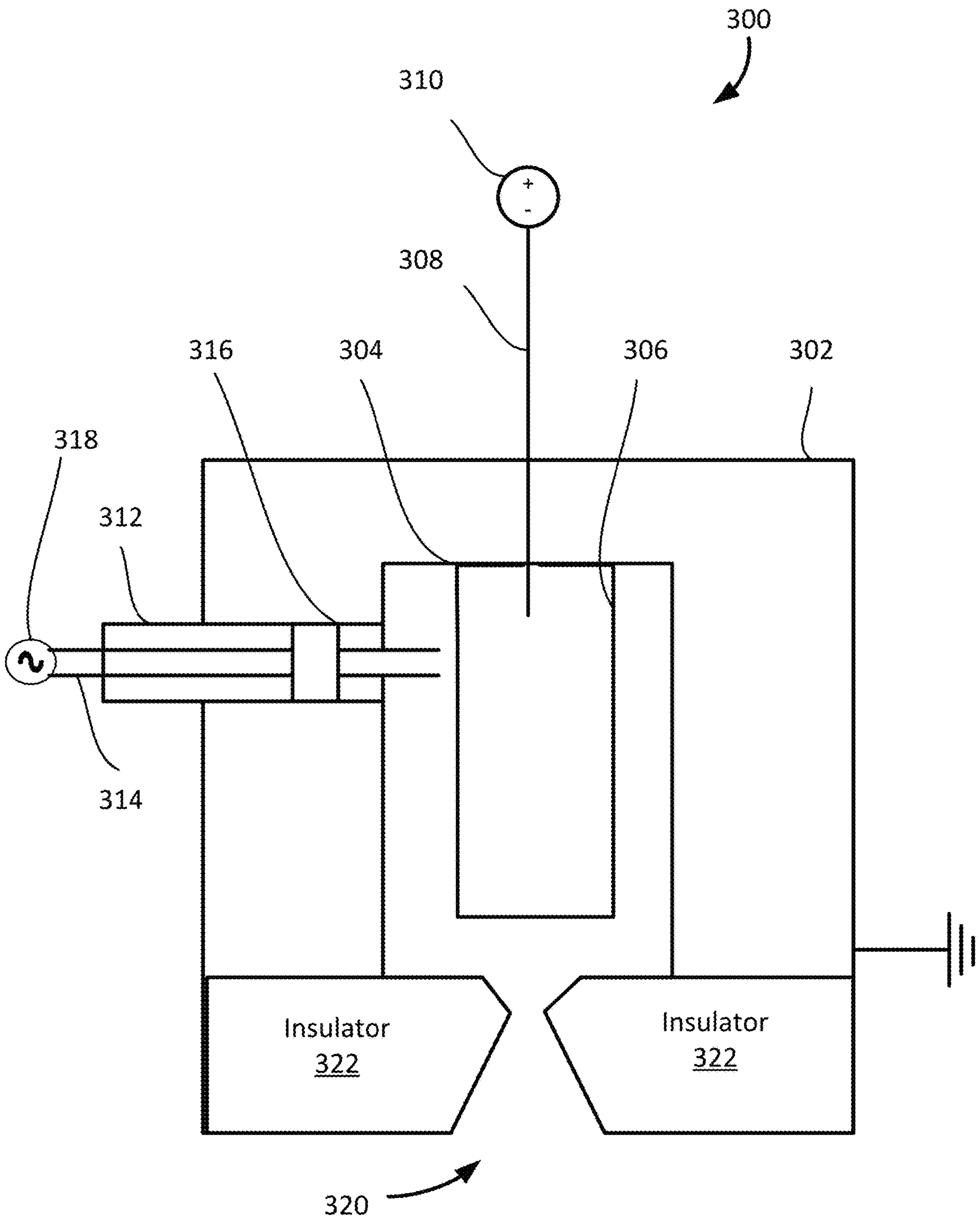
FIG. 3 illustrates a system for igniting plasma using a radio frequency (RF) coaxial resonator configured as an electron floodgun, according to some embodiments.

FIG. 3 shows a system for igniting plasma using a radio frequency (RF) coaxial resonator configured as an electron floodgun, according to some embodiments. A coaxial resonator allows for the transmission of a narrow band of EM waves. For example, a common configuration of a coaxial resonator is a λ/4 resonator, which only transmits EM waves where the wavelength of the wave is ¼ the length of the coaxial resonator (or multiples thereof). The coaxial resonator generates a strong electromagnetic (EM) field when a current characterized by a resonant frequency of the coaxial resonator is carried by an inner body of the coaxial resonator. At sufficient power levels, a plasma may form at an end of the coaxial resonator.

The system 300 may include a main plasma source body 302 and a direct current (DC) coaxial resonator including an outer DC resonator body 304, an inner DC resonator body 306, a DC connection 308, and a DC source 310. The system 300 may also include an RF coaxial resonator, including an outer RF resonator body 312, an inner RF resonator body 314, and a DC isolation block 316. The system 300 may also include an insulator 322 and a chamber window 320. The chamber window 320 may lead to a semiconductor processing chamber, such as the semiconductor processing chamber 102 in FIG. 1.

The DC source 310 may provide a current, via DC connection 308 to the inner DC resonator body 306. The current may then return through the outer DC resonator body 304. An electromagnetic field may form between the inner DC resonator body 306 and outer DC resonator body 304. When a frequency is applied to the inner DC resonator body at a sufficient power, a plasma may form near the chamber window 320.

The inner RF resonator body may be connected to an alternating current (AC) power source 318. In some embodiments, the AC power source 318 may provide a current utilizing a frequency in the microwave range ($3\times10^8$–$3\times10^{11}$ Hz). The inner RF resonator body may extend into the outer DC resonator body 304, enabling electrons to enter the DC coaxial resonator. When the AC power source 318 provides a current near a resonant frequency of the RF coaxial resonator, a plasma may form at the end of the inner RF resonator body 314.

The outer RF resonator body may be in electrical contact with the main plasma source body 302. In some embodiments, the main plasma source body 302 may be electrically grounded. The RF coaxial resonator is therefore at a lower electrical potential than the DC coaxial resonator, and electrons may be driven into the DC coaxial resonator. The configuration of the RF coaxial resonator may be referred to as an electron floodgun, as it provides an electron beam.

In order to prevent unwanted electromagnetic effects from altering the RF coaxial resonator, the RF coaxial resonator may be isolated from DC currents. A DC isolation block connector 316 may isolate the AC coaxial resonator from the DC current in the DC coaxial resonator. In some embodiments, the DC isolation block connector 316 may include ceramics, along with other suitable materials.

The DC coaxial resonator may act as the main plasma source for a semiconductor processing chamber, in place of main plasma source 104 in FIG. 1. As in FIG. 1, the power of the DC coaxial resonator may be varied according to a recipe being executed by one or more processors. In some embodiments, the DC coaxial resonator may have a supply of high energy electrons provided by the RF coaxial resonator, via inner RF resonator body 314, which may function as the auxiliary plasma source described above. The supply of high energy electrons may allow the DC coaxial resonator to use less power to restrike or sustain a plasma at various power levels. Furthermore, by using the RF coaxial resonator as the ignition source for the DC coaxial resonator, the plasma may be formed more consistently as compared to traditional methods.

Furthermore, while the RF coaxial resonator is shown as providing electrons to the DC coaxial resonator, other configurations are possible. For example, the RF coaxial resonator may be used as the auxiliary plasma source 220 in FIG. 2 attached to the processing chamber rather than the main plasma source. In that case, the RF coaxial resonator may provide a supply of electrons to the semiconductor processing chamber 202, allowing for maintenance of a plasma directly inside the semiconductor processing chamber 202.

Although the system 300 shows the DC coaxial resonator being ignited or maintained by the RF coaxial resonator, other embodiments may use alternate plasma sources. For example, the DC coaxial resonator may be replaced by any plasma source, including a surface wave generating plasma source such as a surfatron, a coaxial resonator in various configurations (e.g., with a quartz reactor), a toroidal plasma generator, and/or other alternatives. The other plasma sources may also be configured as an electron floodgun.

Figure 4:
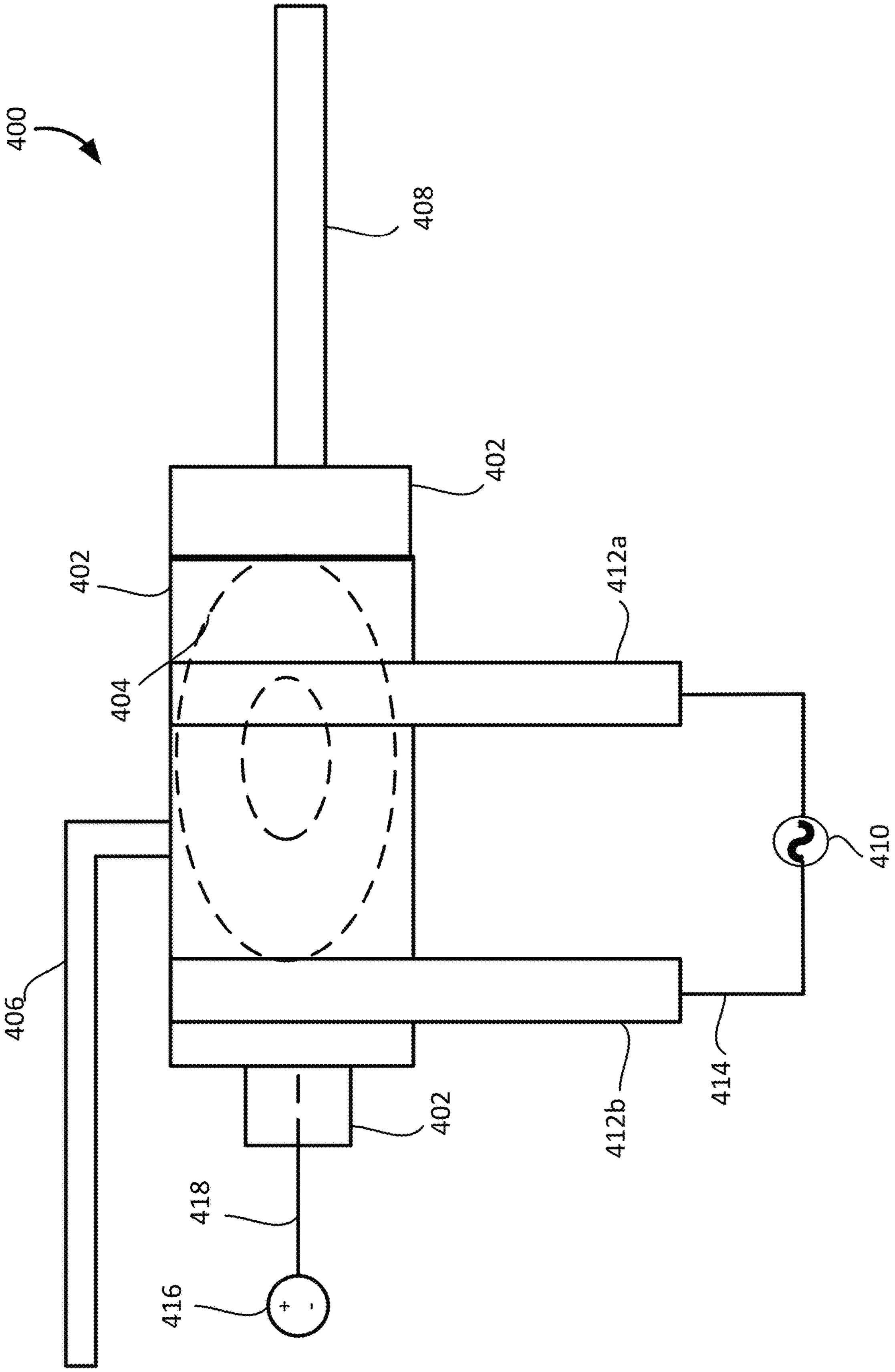
FIG. 4 illustrates a toroidal plasma source configured as a toroidal electron floodgun, according to some embodiments.

FIG. 4 shows a toroidal plasma source configured as a toroidal electron floodgun, according to some embodiments. Although the toroidal electron floodgun 400 is shown in isolation, the toroidal electron floodgun 400 may be applied to any of the embodiments herein. For example, the toroidal electron floodgun 400 may be the auxiliary plasma source 220 in FIG. 2. In another embodiment, the toroidal electron floodgun may be used in place of or in addition to the RF coaxial resonator in FIG. 3.

The toroidal electron floodgun 400 may include a floodgun body 402. A toroidal chamber 404 may be contained within the floodgun body 402. A gas inlet 406 may pass through floodgun body 402 to deliver a gas to the toroidal chamber 404. The toroidal chamber may also be electrically grounded. A plasma exhaust 408 may be connected to toroidal chamber 404 at a first end. In some embodiments, the plasma exhaust 408 may be connected at a second end to a semiconductor processing chamber such as the semiconductor processing chamber 202 in FIG. 2. In some embodiments, the second end may be connected to another plasma source, such as the DC coaxial resonator in FIG. 3.

The toroidal floodgun 400 may also include an alternating current (AC) power source 410, electrically connected to conductors 412*a* and 412*b* via an AC pathway 414. In some embodiments, the AC power source may provide a current with a frequency in the microwave range ($3\times10^8$–$3\times10^{11}$ Hz). In other embodiments, the AC power source 410 may provide a current with a frequency in the RF range ($3\times10^5$–$3\times10^8$ Hz). The current may flow through the conductors 412*a* and 412*b*, creating a magnetic field alternating between being directed into the toroid chamber 404 and being directed away from the toroidal chamber 404. The current may also create a toroidal electrical field around the conductors 412_a_ and 412_b_. The changing magnetic field and the toroidal electrical field may drive the gas around the toroidal chamber 404, generating the plasma.

In some embodiments, the floodgun body 402 may be connected to a DC source 416 via a DC pathway 418. The DC source 416 may provide a current that creates a voltage between the toroidal electron floodgun 400 and a semiconductor processing chamber or a plasma source, as may be attached at the second end of plasma exhaust 408. Because of this voltage, electrons may be driven from the toroidal electron floodgun 400 to the semiconductor processing chamber or the plasma source, as is attached at the second end of plasma exhaust 408. Thus, the toroidal electron floodgun 400 may be used as an auxiliary plasma source such as the auxiliary plasma source 220 in FIG. 2, or in place of or addition to the RF coaxial resonator in FIG. 3.

Figure 5:
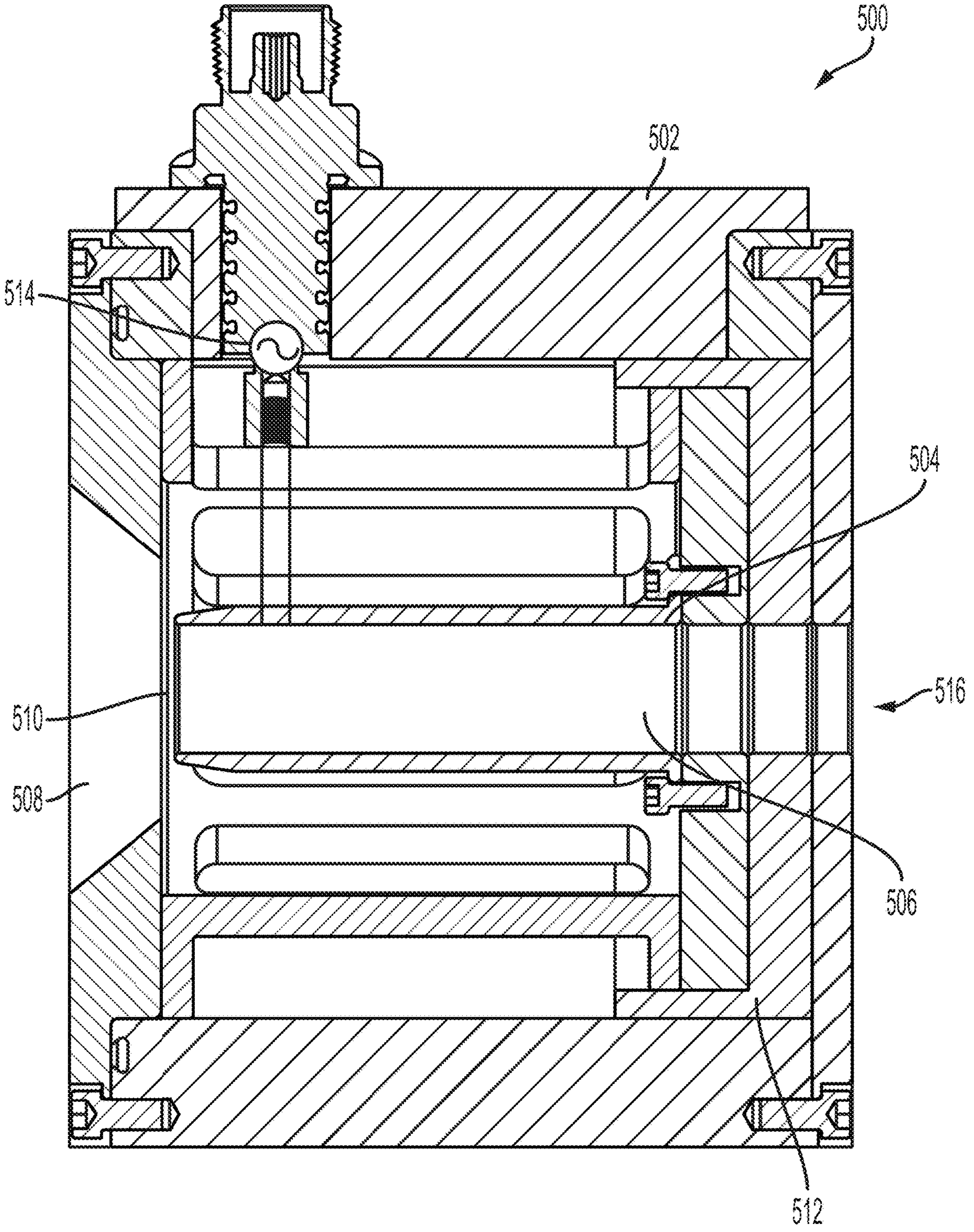
FIG. 5 illustrates a surface wave plasma source, according to some embodiments.

FIG. 5 shows a surface-wave-generating plasma source 500, according to some embodiments. The surface wave plasma source 500 may include a plasma source housing 502. The plasma source housing 502 may include an inner tube 504 and a launching plate 508. A launching gap 510 may be present between the inner tube 504 and the launching plate 508. A dielectric tube 506 may be inside of the inner tube 504, and a radio frequency (RF) power source 514 may be in contact with the inner tube 504.

During operation, the RF power source 514 may provide an alternating current to the inner tube 504. In some embodiments, the alternating current may be provided at a frequency range between approximately 10 MHz and 3 GHz. The alternating current may be provided at a power level between approximately 1 W and 2000 W. The alternating current may flow across the inner tube 504 creating an electric field around the inner tube 504. The electric field may be along an axial direction of the dielectric tube 506.

Also during operation, a gas such as Argon or Helium may be provided to the dielectric tube 506 through a gas port 516. In some embodiments, the alternating current provided through inductive coupling to the inner tube 504 may be provided at a sufficient level such that as the gas moves through the dielectric tube 506 and the electric field, the gas thereby becomes a plasma. In other embodiments, the alternating current provided through capacitive coupling to the inner tube 504 may be provided at a sufficient level such that as the gas moves through the dielectric tube 506 and the electric field, the gas thereby becomes a plasma. The alternating current may further form surface waves that are propagated to the plasma from the launching gap 510. The surface waves may in turn drive electrons along the direction of propagation towards the launching gap 510, forming an ionized front that leads the plasma.

As the surface waves are launched from the launching gap 510, the plasma and ionized front may be propelled towards the launching plate 508. In some embodiments, the launching plate 508 may be manufactured from a metal. A difference in electric potential between the plasma and the launching plate 508 may further drive the ionized front and plasma toward in the axial direction of the dielectric tube 506.

In some embodiments, the launching plate 508 may be configured to direct the ionized front and the plasma towards a semiconductor processing chamber, such as the semiconductor processing chamber 202 in FIG. 2. In other embodiments, the launching plate may be in contact with a main plasma source, such as the DC coaxial resonator in FIG. 3. Thus, the surface wave plasma source 500 may be used as an auxiliary plasma source configured to deliver a supply of high-energy electrons to a semiconductor processing chamber and/or another plasma source. Because the surface wave plasma source 500 may deliver a supply of electrons, the surface wave plasma source 500 may be used to strike or sustain a plasma generated from another source, allowing the other source to be operated at lower powers and varied according to a recipe.

Figure 6:
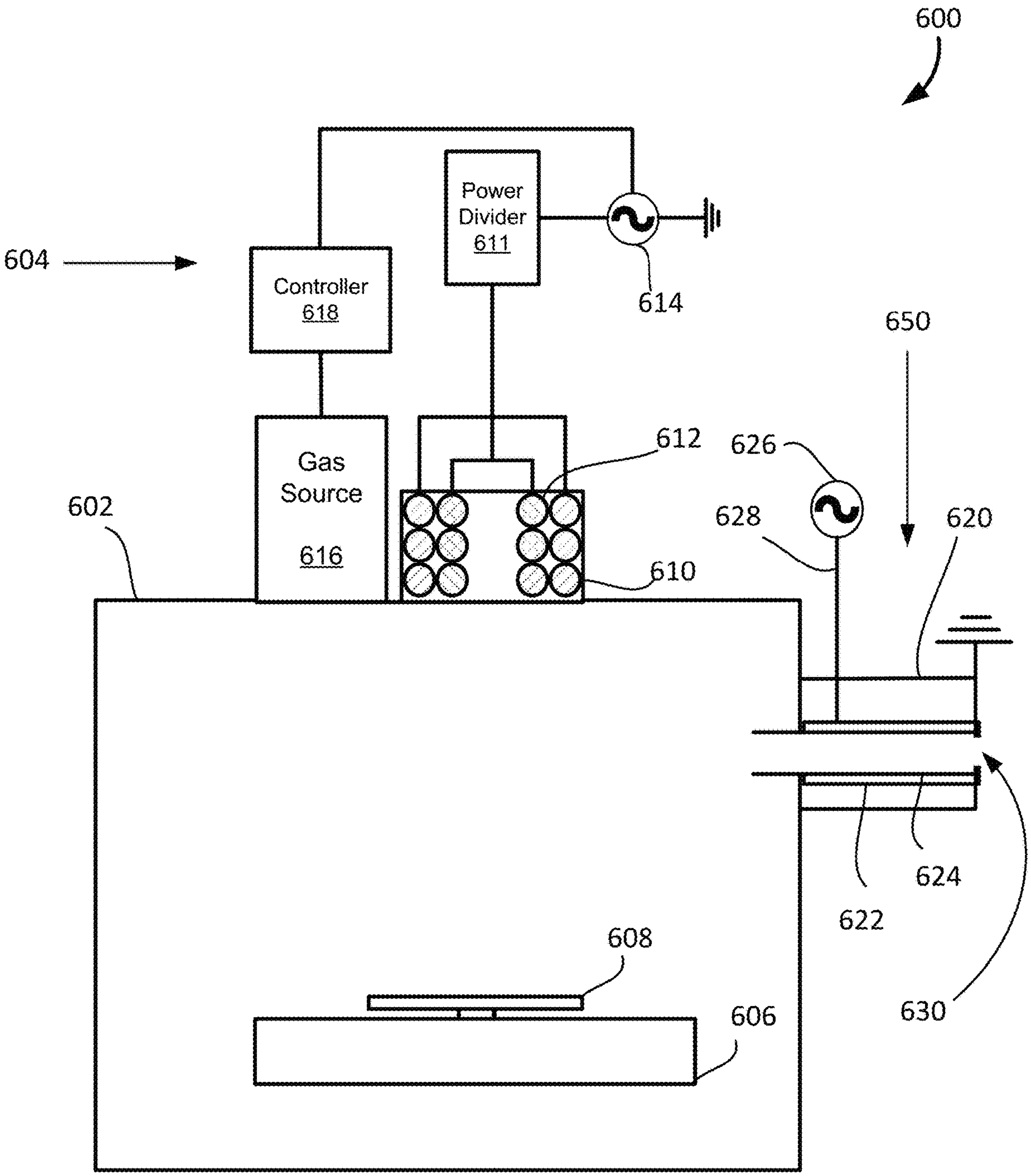
FIG. 6 illustrates a semiconductor processing system using a surface wave plasma source as an auxiliary plasma source, according to some embodiments.

FIG. 6 shows a semiconductor processing system using a surface wave plasma source as an auxiliary plasma source, according to certain embodiments. The system 600 may include a semiconductor processing chamber 602, a main plasma source 604, and an auxiliary plasma source 620. In some embodiments, the semiconductor processing chamber 602 and the main plasma source 604 may be similar to those pictured in FIG. 1. The labelled components 602-618 may therefore function similarly to the corresponding components 102-118 in FIG. 1. As in FIG. 1, although the main plasma source 604 is shown as an inductively coupled plasma source, the main plasma source 604 may be any type of plasma source, including a capacitively coupled plasma source, or any other plasma source.

The system 600 may also include a surface wave plasma source 650. The surface wave plasma source 650 may include an outer wall 620. In some embodiments, the outer wall 620 may be manufactured from a metal. The outer wall 620 may also be electrically grounded. The outer wall 620 may house an inner tube 622 that surrounds a dielectric tube 624. In some embodiments, the inner tube 622 may be manufactured from aluminum. The dielectric tube 624 may be manufactured from quartz. The dielectric tube 624, the inner tube 622, and the outer wall 620 may include a gas port 630 that allows a gas to enter the dielectric tube 624.

The surface wave plasma source 650 may also include an RF power source 626 that delivers an alternating current to the inner tube 622 via an AC pathway 628. In some embodiments, the alternating current may be provided at a frequency range of between approximately 10 MHz and 3 GHz. The alternating current may additionally be provided at a power level between approximately 1 W and 2000 W.

In some embodiments, the semiconductor processing chamber 602 may be configured to execute a recipe to process the semiconductor wafer 608. The main plasma source 604 may be configured to provide a plasma to the semiconductor processing chamber 602 and to be duty cycled during the execution of the recipe. The surface wave plasma source 650 may be configured to maintain the plasma in the semiconductor processing chamber 602 throughout the execution of the recipe. In some embodiments, the surface wave plasma source 650 may perform as the surface wave plasma source 500, described in FIG. 5. As with the surface wave plasma source 500, the surface wave plasma source 650 may provide a supply of electrons to the semiconductor processing chamber 602.

Although FIG. 6 shows only one surface wave plasma source 650, the system 600 may include any number of surface wave plasma sources. A surface wave plasma source may be smaller than a different type of plasma source with the same operating frequency. This is because surface wave plasma sources do not necessarily have a minimum length determined by a wavelength associated with the operating frequency. Therefore, it may be practical to include additional surface wave plasma sources in a single system like the system 600.

Figure 7:
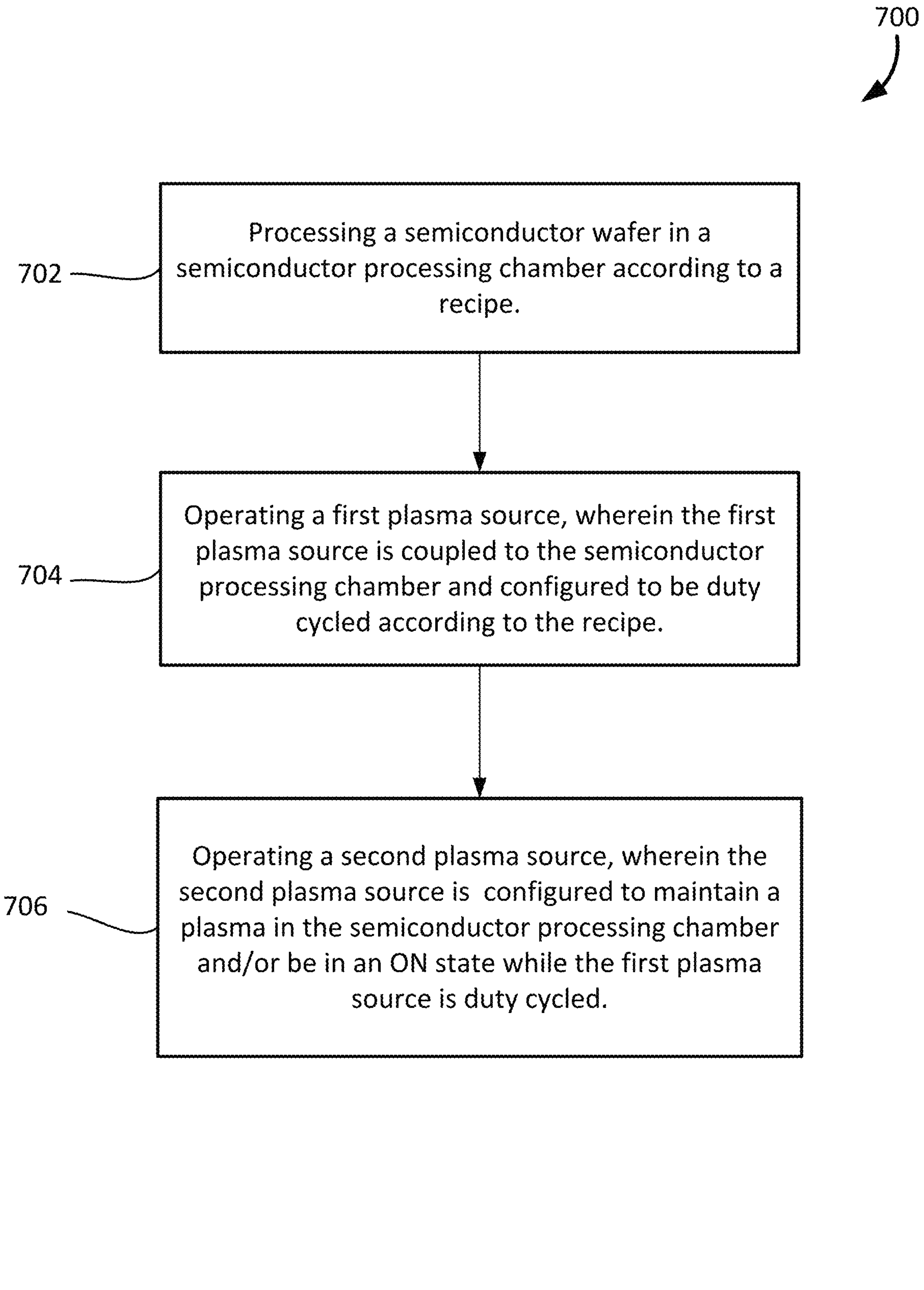
FIG. 7 illustrates a flowchart of a method for providing plasma to a semiconductor processing chamber, according to some embodiments.

FIG. 7 illustrates a flowchart of a method for providing plasma to a semiconductor processing chamber, according to some embodiments. At block 702, the method may include processing a semiconductor wafer in a semiconductor processing chamber according to a recipe. In some embodiments, the semiconductor processing chamber is held at a constant pressure.

At block 704 the method 700 may include operating a first plasma source according to the recipe, where the source is coupled to the semiconductor processing chamber. The first plasma source may also be configured to be duty cycled during the execution of the recipe. The first plasma source may provide a plasma to the semiconductor processing chamber. In some embodiments, the first plasma source may be a main plasma source, such as the main plasma source 204 in FIG. 2. The plasma may include Argon, Helium, or other similar plasma gasses. The first plasma source may be an inductively coupled plasma source, a capacitively coupled plasma source, or any other type of plasma source.

At block 706, the method 700 may include operating a second plasma source, configured to maintain the plasma in the semiconductor processing chamber. The second plasma source may maintain the plasma during the execution of the recipe while the first plasma source is duty cycled. The second plasma source may include a surface wave generating plasma source such as a surfatron, a coaxial resonator in various configurations, a toroidal plasma generator, along with other configurations. In some embodiments, the second plasma source may by an auxiliary plasma source, such as the auxiliary plasma source 220 in FIG. 2. In some embodiments, the second plasma source may turn ON prior to operating the first plasma source at block 704. The second plasma source may assist the first plasma source to initially strike the plasma, then stay ON to maintain the plasma while the first plasma is duty cycled throughout the recipe execution.

In some embodiments, the second plasma source may provide a supply of electrons to the semiconductor processing chamber. The second plasma source may provide the electrons to the semiconductor processing chamber through diffusive effects as a leaky plasma or by driving the plasma. For example, the second plasma source may use an electrical potential to drive the plasma into the semiconductor processing chamber, such as with an electron beam or electron floodgun.

In some embodiments, the first plasma source may be duty cycled between a plurality of power levels. A first power level may result in the first plasma source striking a plasma in the semiconductor processing chamber. A second power level may result in the plasma in the semiconductor processing chamber being quenched and transitioning to a gaseous state. A third power level may restrike the plasma in the semiconductor processing chamber, resulting in the plasma transitioning from a gaseous state to a plasma state. The third power level may use less energy than the first power level. The duty cycle may be operated in a range of approximately 5% to 95%. In other embodiments, the second power level may be characterized by a reduction in an energy of the plasma. In that case, the auxiliary plasma source may sustain the plasma in the semiconductor processing chamber. The third power level may cause the main plasma source to raise the energy of the plasma. Because the plasma may be sustained by the auxiliary plasma source, the plasma may not need to be restruck.

In some embodiments, the second plasma source may provide a supply of high-energy electrons to the first plasma source. The second plasma source may provide the electrons to the first plasma source through diffusive effects as a leaky plasma, or by driving the plasma. For example, the second plasma source may use an electrical potential to drive the plasma into the first plasma source, such as with an electron beam or electron floodgun.

It should be appreciated that the specific steps in FIG. 7 provide particular methods of providing plasma to a semiconductor processing chamber according to various embodiments. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. Many variations, modifications, and alternatives also fall within the scope of this disclosure.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed but could have additional steps not included in a figure. A process may correspond to a method, a function, a procedure, a subroutine, a subprogram, etc. When a process corresponds to a function, its termination can correspond to a return of the function to the calling function or the main function.

What is claimed is:

1. A method for providing plasma to a semiconductor processing chamber, the method comprising:

processing a semiconductor wafer in the semiconductor processing chamber according to a recipe;

operating, by a controller, a first plasma source according to the recipe, wherein the first plasma source provides a plasma to the semiconductor processing chamber and duty cycles the first plasma source during execution of a recipe between a plurality of power levels comprising:

a first power level that results in the first plasma source striking the plasma in the semiconductor processing chamber;

a second power level that results in the plasma in the semiconductor processing chamber being quenched and transitioning to a gaseous state; and a third power level that restrikes the plasma in the semiconductor processing chamber resulting in the plasma transitioning from the gaseous state to a plasma state, wherein the third power level uses less energy than the first power level; and operating, by the controller, a second plasma source, wherein the second plasma source is in an ON state while the first plasma source is duty cycled.

2. The method of claim 1, wherein operating the second plasma source provides a supply of electrons to the semiconductor processing chamber.

3. A semiconductor processing system comprising:

a semiconductor processing chamber configured to process a semiconductor wafer;

a first plasma source a second plasma source; and a controller programmed with instructions representing a recipe to perform operations comprising:

causing the first plasma source to provide a plasma to the semiconductor processing chamber and to duty cycle the first plasma source during execution of a recipe between a plurality of power levels comprising:

a first power level that results in the first plasma source striking the plasma in the semiconductor processing chamber;

a second power level that results in the plasma in the semiconductor processing chamber being quenched and transitioning to a gaseous state; and a third power level that restrikes the plasma in the semiconductor processing chamber resulting in the plasma transitioning from the gaseous state to a plasma state, wherein the third power level uses less energy than the first power level; and causing the second plasma source to maintain the plasma in the semiconductor processing chamber during the execution of the recipe while the first plasma source is duty cycled.

4. The semiconductor processing system of claim 3, wherein the controller is further programmed to cause the first plasma source to be duty cycled between a plurality of power levels comprising a first power level that results in the first plasma source striking the plasma in the semiconductor processing chamber and a second power level where the plasma is sustained in the semiconductor processing chamber.

5. The semiconductor processing system of claim 3, wherein the controller is further programmed to cause the second plasma source to provide a supply of electrons to the first plasma source.

6. The semiconductor processing system of claim 3, wherein the controller is further programmed to hold the semiconductor processing chamber at a constant pressure.

7. The semiconductor processing system of claim 3, wherein the recipe being executed on the semiconductor wafer is characterized by a duty cycle causing the first plasma source to be cycled between a plurality of power levels, and the second plasma source is configured to be in an ON state before the first plasma source initially strikes the plasma in the semiconductor processing chamber.

8. The semiconductor processing system of claim 7, wherein the duty cycle operates in a frequency range of 5 Hz to 5000 Hz.

9. The semiconductor processing system of claim 3, wherein the second plasma source comprises a microwave coaxial resonator.

10. The semiconductor processing system of claim 9, wherein the microwave coaxial resonator is configured as an electron floodgun.

11. The semiconductor processing system of claim 3, wherein the second plasma source comprises a toroidal plasma source configured as an electron floodgun.

12. The semiconductor processing system of claim 3, wherein the second plasma source comprises a surface wave plasma source.

13. The semiconductor processing system of claim 12, wherein the surface wave plasma source uses capacitive coupling to generate the plasma.

14. The semiconductor processing system of claim 12, wherein the surface wave plasma source uses inductive coupling to generate the plasma.

15. The semiconductor processing system of claim 3, wherein the semiconductor processing chamber and the first plasma source are integrated parts of the semiconductor processing system.

16. A semiconductor processing system comprising:

a semiconductor processing chamber configured to process semiconductor wafers;

a plasma source a surface-wave-generating plasma source; and a controller programmed with instructions representing a recipe to perform operations comprising:

causing the plasma source to provide a plasma to the semiconductor processing chamber and to duty cycle the plasma source during execution of a recipe between a plurality of power levels comprising:

a first power level that results in the plasma source striking the plasma in the semiconductor processing chamber;

a second power level that results in the plasma in the semiconductor processing chamber being quenched and transitioning to a gaseous state; and a third power level that restrikes the plasma in the semiconductor processing chamber resulting in the plasma transitioning from the gaseous state to a plasma state, wherein the third power level uses less energy than the first power level; and causing the surface-wave-generating plasma source to maintain the plasma in the semiconductor processing chamber through the execution of the recipe on the semiconductor wafers.

17. The semiconductor processing system of claim 16, wherein the plasma source comprises a toroidal plasma source.

18. The semiconductor processing system of claim 16, wherein the plasma source comprises a coaxial resonator.

* * * * *